United States Patent [19]

Wagner et al.

[11] Patent Number: 4,600,892
[45] Date of Patent: Jul. 15, 1986

[54] RF AMPLIFIER WITH FREQUENCY SPECTRUM CONTROL

[75] Inventors: Gene A. Wagner, Torrance; Irwin L. Newberg, Northridge, both of Calif.

[73] Assignee: Hughes Aircraft Company, Los Angeles, Calif.

[21] Appl. No.: 626,098

[22] Filed: Jun. 28, 1984

[51] Int. Cl.$^4$ ............................................. H03G 9/20
[52] U.S. Cl. .................................. 330/144; 330/149; 330/185; 328/155; 343/17.2 R
[58] Field of Search ............... 330/144, 145, 157, 185, 330/129, 284, 305, 149; 328/155; 343/17.2 R

[56] References Cited

U.S. PATENT DOCUMENTS

| | | | |
|---|---|---|---|
| 3,900,823 | 8/1975 | Sokal et al. | 330/129 X |
| 4,134,114 | 1/1978 | Riggs et al. | 343/17.2 R |

FOREIGN PATENT DOCUMENTS

| | | |
|---|---|---|
| 2835751 | 10/1979 | Fed. Rep. of Germany . |
| 2387547 | 11/1978 | France . |
| 2011741 | 7/1979 | United Kingdom . |
| 2059217 | 4/1981 | United Kingdom . |

OTHER PUBLICATIONS

High Power Radar Implementation of Coherent Waveforms, A. S. Acampora, IEEE Translations on Aerospace and Electronic Systems, vol. AES-12, No. 4, Jul. 1976, pp. 444–450.

Primary Examiner—James B. Mullins
Attorney, Agent, or Firm—Leonard A. Alkov; A. W. Karambelas; Lawrence V. Link, Jr.

[57] ABSTRACT

An RF amplifier arrangement for providing output signals having a controlled frequency distribution and wherein the amplitude and phase of the input signals to an RF amplifier are controlled as a function of the amplitude and phase, respectively, of the output signals from the RF amplifier and also the amplitude of the input signals are adjusted so as to cause the power of the output signal to vary in accordance with a predetermined sequence, whereby such amplitude control of the input signals results in a modified frequency distribution in the energy of the output signals.

4 Claims, 8 Drawing Figures 4,600,892

RF AMPLIFIER WITH FREQUENCY SPECTRUM CONTROL

BACKGROUND OF THE INVENTION

This invention relates generally to RF amplifiers and, more particularly, to an RF amplifier arrangement for providing output signals having a controlled or modified frequency distribution.

In many applications, such as radar systems, for example, it is desirable to control the output signal spectrum of a transmitter in order to concentrate the output power in the frequency bands needed to implement a desired function. For the radar example this might be to match the output signals spectrum to a required task, such as providing unique waveforms for special signal processing and/or minimizing interference with nearby radars (friendly interference).

One approach to obtaining such frequency spectrum control is by directly attenuating the high power output of a transmitter that is being operated in saturation. This requires using large components to handle the high power and such components are generally more expensive, larger, heavier, hotter operating, slower operating, and less reliable than components that operate at the lower power of the input signal drive to the transmitter. Spectrum control at the output of the high power RF amplifier is consequently not generally tried because of problems with handling the power at the device's output.

SUMMARY OF THE INVENTION

It is, therefore, a primary object of the invention to provide an improved arrangement for frequency spectrum control of the output signals from an RF amplifier.

Another object is to provide an improved arrangement for frequency spectrum control of the output signals from an RF amplifier which arrangement will not cause a significant increase in equipment cost, weight and volume while maintaining good performance and reliability.

A further object is to provide an improved arrangement for frequency spectrum control for the output signal of an RF amplifier while providing acceptable noise performance even though the RF amplifier is operated out of its saturation region.

Yet another object of the invention is to provide for frequency spectrum control of the output signals from an RF amplifier in an arrangement which is compatible with special signal processing, such as pulse compression.

The subject invention provides for amplitude control of the input signals to an RF amplifier so as to provide a predetermined variation in the output power of the amplifier, which variation causes a desired modification in the output frequency spectrum of the amplifier's output signal. In accordance with one embodiment of the invention a computer controlled feedback loop is employed to provide the amplitude control of the amplifier's output signals and phase control is also implemented by means of a feedback loop. One such embodiment comprises an RF amplifier and circuit means for adjusting the amplitude and phase of the input signals to the amplifier as a function of the amplitude and phase, respectively, of the output signals from the amplifier and for also adjusting the amplitude of the input signals so as to cause the power of the output signals to vary in accordance with the predetermined sequence whereby such amplitude control of the input signals results in a modified frequency distribution in the energy of the output signals. The circuit means may incluce a source of RF signals, a controllable power adjustment device coupled to receive a portion of the output power from the RF amplifier, computer means programmed to control the relative response of the power adjustment device in accordance with the predetermined sequence and modulators coupled between the output of the RF signal source and the input of the amplifier for adjusting the phase and amplitude of the input signal as a function of the phase and amplitude, respectively, of the output signal from the power adjustment device.

One embodiment of the invention further comprises means for measuring the output power of the RF amplifier and the computer means includes an arrangement for scanning the controllable power adjustment device over a range of values and for storing the resultant parameters that produce the RF output power levels of the predetermined sequence.

BRIEF DESCRIPTION OF THE DRAWINGS

The novel features of this invention as well as the invention itself will be better understood from the accompanying description taken in connection with the accompanying drawings in which like reference characters refer to like parts and in which.

DETAILED DESCRIPTION OF THE PREFERRED EMBODIMENT

Figure 1:
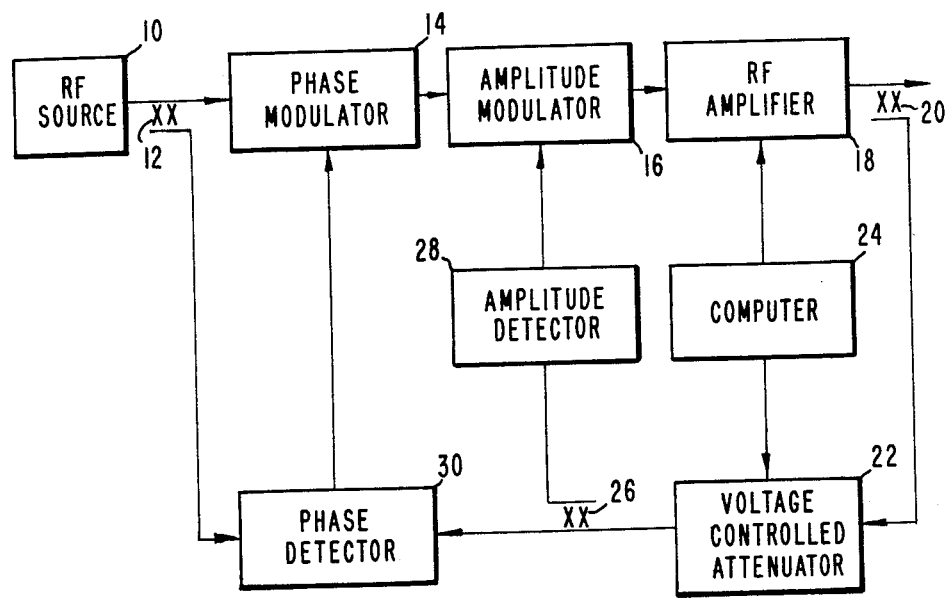
FIG. 1 is a block diagram of an RF amplifier arrangement in accordance with the subject invention wherein the frequency spectrum of the output signal from the RF amplifier is controlled by means of amplitude control of the amplifier's input signal.
Figure 2:
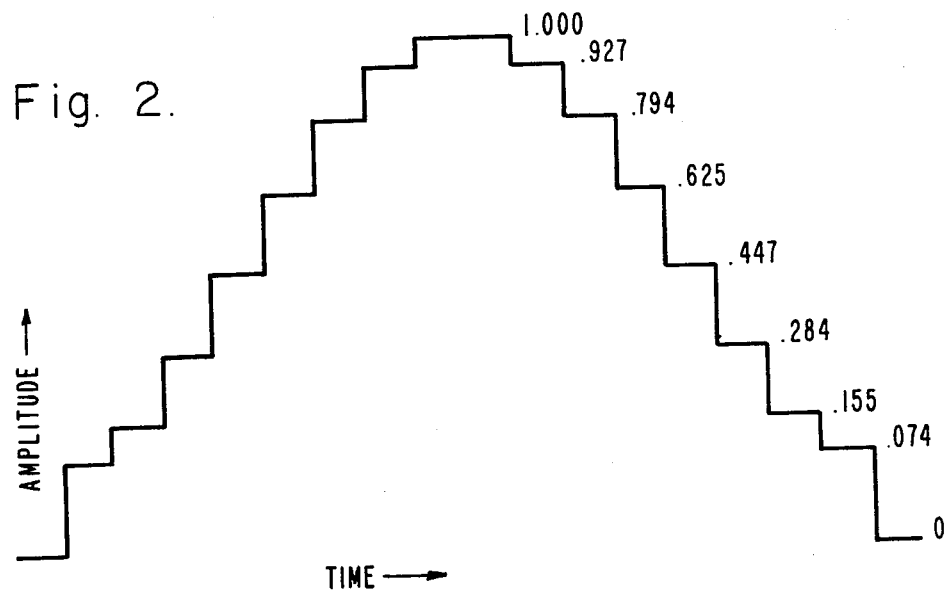
FIG. 2 illustrates an amplitude weighted pulse having Dolph-Chebychev weighting which is associated with 45 dB sidelobe levels.
Figure 3:
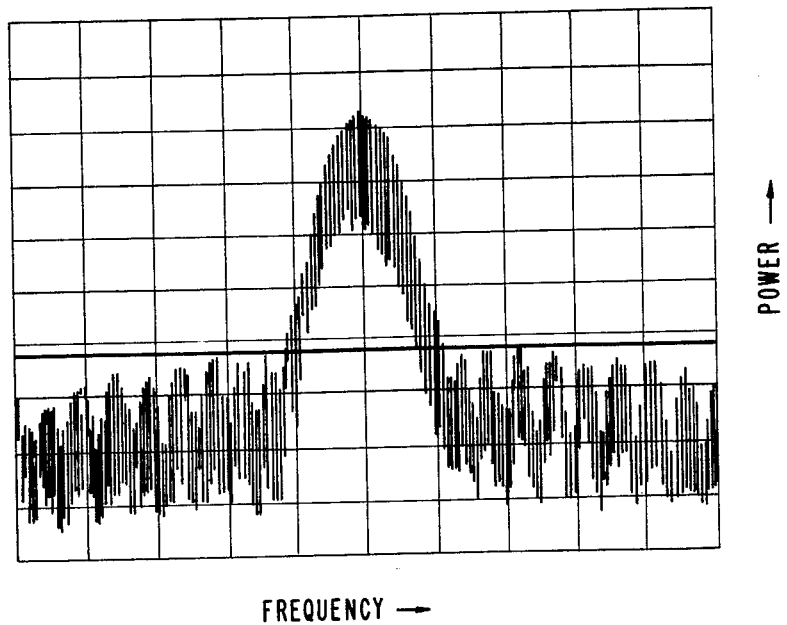
FIG. 3 illustrates the expected frequency spectrum of the output signal for the RF amplifier arrangement of FIG. 1.
Figure 4:
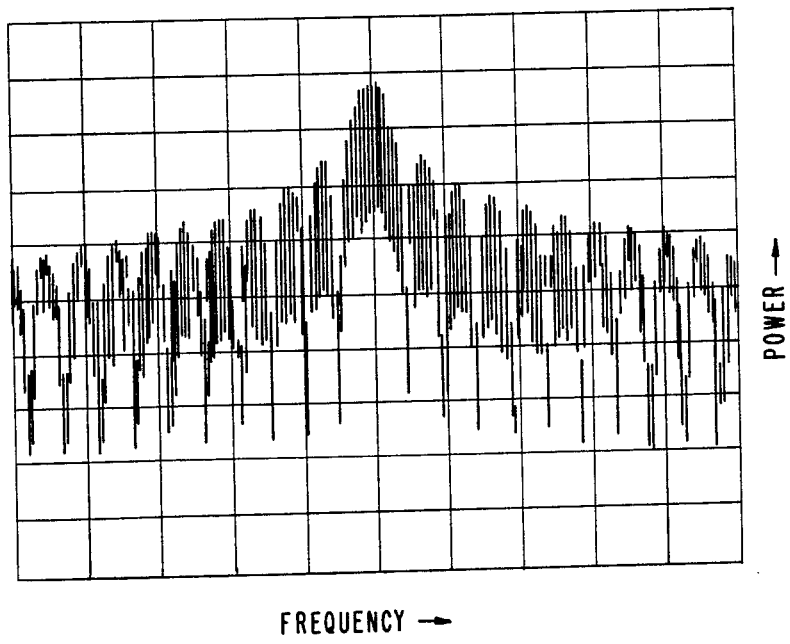
FIG. 4 is a typical spectrum of the output signals from a pulsed transmitter without waveform amplitude control.

Referring first primarily to FIG. 1, the frequency spectrum controlled RF amplifier arrangement there shown includes an RF source 10, a directional coupler 12, phase and amplitude modulators 14, and 16, respectively, and an RF power amplifier 18. The output signal from amplifier 18 is applied to a utilization device such as a radar antenna (not shown) and a sample thereof is applied through a directional coupler 20 to a voltage controlled attenuator 22. The amount of attenuation applied by voltage controlled attenuator 22 is determined by signals applied from a computer 24 to the control input of attenuator 22. The computer is programmed so as to provide a predetermined sequence of weighting function parameters. An amplitude detector 28 and amplitude modulator 16 are part of a feedback loop which operates to maintain the input signal to amplitude detector 26 at a constant power level. Therefore, the output power from amplifier 18 can be controlled and shaped by controlling the attenuation provided by the voltage controlled attenuator 22. Hence, the shape of the output signal from the RF amplifier 18 is determined by the control signals applied to attenuator 22 from the computer 24. As noted hereinabove, and as shown in FIGS. 3 and 4, amplitude control of the RF outputs pulses translates into modification of the frequency spectrum of these pulses. An example of a set of weighting function parameters is illustrated in FIG. 2 for Dolph-Chebychev weights for 45 dB sidelobes. FIG. 3 shows the resulting spectrum for such a weighted waveform which has a 300 Hz pulse repetition frequency, a center frequency of 9.8 GHz, step width of 26 microseconds and a duty factor of 0.125. In FIG. 3 the vertical scale is 10 dB per division and the horizontal scale is 5.0 kHZ per division.

For comparison purposes, FIG. 4 shows the spectrum of a similar pulsed waveform without amplitude weighting. It is noted that there is substantial improvement in sidelobe levels for a spectrum (FIG. 3) associated with the embodiment of FIG. 1. However, it is also noted that the improved spectrum is at the expense of a loss of some average output power and some widening of the spectrum in the region of the carrier.

Table I shows Dolph-Chebychev amplitude weights for 35 dB, 40 dB, 45 dB and 50 dB sidelobes. Since the RF amplifiers are generally not linear devices the values of attenuation command signals are derived from a set of prior measurements made on the amplifier arrangement. For example, the maximum output power level is selected and assigned the value "1.000" and then the input signal to attenuator 22 is adjusted until the power represented by the respective steps shown in FIG. 2 and Table I are obtained and then computer 24 is programmed accordingly.

TABLE I

| STEP | SIDELOBE LEVEL | | | |
|---|---|---|---|---|
| | 35 dB | 40 dB | 45 dB | 50 dB |
| 1 | 0.179 | 0.114 | 0.074 | 0.050 |
| 2 | 0.250 | 0.196 | 0.155 | 0.123 |
| 3 | 0.389 | 0.332 | 0.284 | 0.244 |
| 4 | 0.544 | 0.493 | 0.447 | 0.406 |
| 5 | 0.701 | 0.661 | 0.625 | 0.591 |
| 6 | 0.840 | 0.816 | 0.794 | 0.773 |
| 7 | 0.944 | 0.935 | 0.927 | 0.919 |
| 8 | 1.000 | 1.000 | 1.000 | 1.000 |
| 9 | 1.000 | 1.000 | 1.000 | 1.000 |
| 10 | 0.944 | 0.935 | 0.927 | 0.919 |
| 11 | 0.840 | 0.816 | 0.794 | 0.773 |
| 12 | 0.701 | .661 | 0.625 | 0.591 |
| 13 | 0.544 | 0.493 | 0.447 | 0.406 |
| 14 | 0.389 | 0.332 | 0.284 | 0.244 |
| 15 | 0.025 | 0.196 | 0.155 | 0.123 |
| 16 | 0.179 | 0.114 | 0.074 | 0.050 |

In certain applications, such as radar transmission the RF output amplifier is sometimes operated in saturation to minimize AM noise from both the input drive source and the amplifier itself. In the embodiment of FIG. 1, since output signal amplitude signal control is effected by controlling the input signal, the amplifier 18 must be operated below saturation; however, acceptable AM noise levels are obtained by means of the amplitude feedback loop which includes the detector 28 and modulator 16. Similarly, phase variations can be expected, for example, with variations in output power and from the operation of attenuator 22. The phase feedback loop which includes a phase detector 30 and phase modulator 14 reduces such phase variations. One input to phase detector 30 is applied from RF source 10 through directional coupler 12 and the other input is applied from voltage controller attenuator 22 through a directional coupler 26. As examples of component types which may be used in the feedback loops, Microwave Associates Part No. MPM 371 includes a stripline phase modulator (0° to 60°) and an amplitude modulator (0 to 50 dB); Part No. MPM 372 includes a 4-bit phase shifter, a phase detector and an amplitude detector; and Part No. MPM 373 is a voltage controlled attenuator. Phase modulator 14 may comprise the combination of the 4-bit digital phase shifter and the stripline continuous phase shifter with suitable control electronics to step the 4-bit phase shifter so as to maintain the loop within the control range of the stripline continuous phase shifter. An example of a system which uses feedback loops to reduce undesirable modulation components in a microwave power amplifier is presented in U.S. Pat. No. 4,134,114 to Riggs et al and is entitled "Radar System Having Amplitude and Phase Modulation and Demodulation".

Still referring primarily to FIG. 1, computer 24 provides gate control signals to RF amplifier 18, which may be a gated TWT, for example, so as to turn the amplifier off between output signal pulses. Alternatively, the computer may control a diode switch (not shown) disposed between modulators 14 and 16, for example, to accomplish the gating function, or both methods may be used to implement improved gating.

Figure 5:
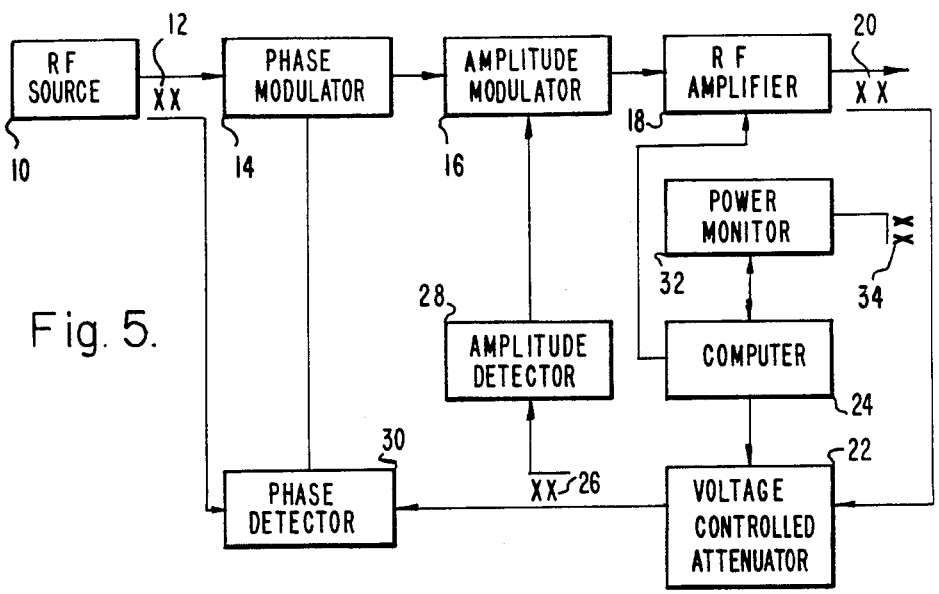
FIG. 5 is an arrangement similar to that of FIG. 1 with the addition of means for measuring and storing the control signal values associated with preselected output power levels.

The configuration of FIG. 5 is similar to that of FIG. 1 with the addition of a power monitor 32 coupled through directional coupler 34 so as to receive a sample of the RF output power from RF power amplifier 18. Computer 24 is programmed so that during a calibration mode of operation voltage controlled attenuator 22 is scanned over a predetermined range of attenuation values and the control parameter (control signals to 22) values and resultant power levels values are stored and tabulated. Then during operation the parameter values for the preselected desired power level sequence (weighting factors) are used. Such a calibration update mode may be run on a programmed schedule or by operator command.

Figure 6:
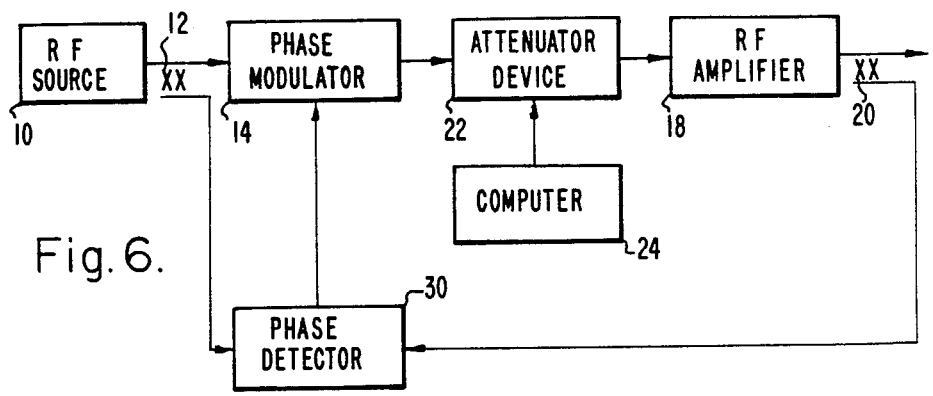
FIG. 6 is an RF amplifier arrangement similar to that of FIG. 1 except that amplitude control of the input signal is provided by open loop computer control of the input signal to the RF amplifier.

The embodiment of FIG. 6 is similar to that of FIG. 1 except that the amplitude control is performed "open loop" by attenuator 22 under control of computer 24. The computer uses a table of attenuation values from a computer memory to set attenuator 22 so as to obtain the desired output power. Phase control is maintained by a feedback loop which includes phase modulator 14 and phase detector 30. It is noted that phase control can reduce frequency modulation (FM) noise which may be the higher noise source in a transmitter's output, i.e., higher than AM noise.

Figure 7:
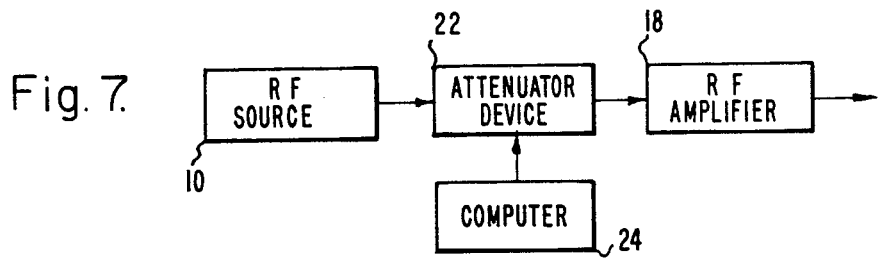
FIG. 7 is an arrangement similar to that of FIG. 6 except that feedback phase control of the input signal to the RF amplifier has not been implemented.

The arrangement of FIG. 7 illustrates the basic concept of frequency spectrum control by control of the input signal to the power amplifier 18. Computer 24 uses a table of attenuation values from a computer memory to control attenuator 22.

Figure 8:
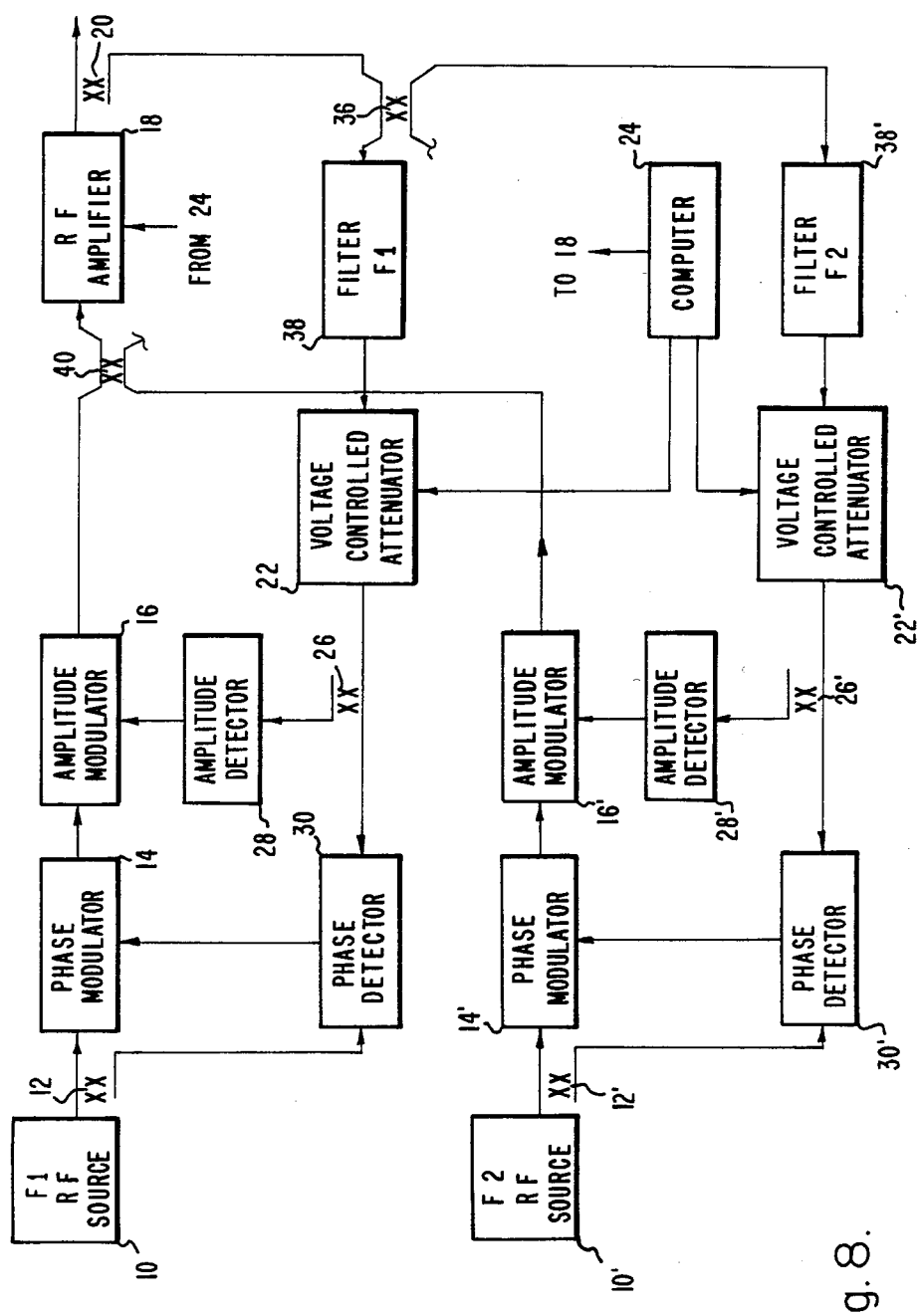
FIG. 8 is a block diagram of an RF amplifier arrangement which implements amplitude control of the amplifier's input signals for the situation in which two carrier frequencies are simultaneously processed.

In accordance with the subject invention, an arrangement which uses pulsed input signals having different carrier frequencies (simultaneous multiple frequencies) can also be implemented. If the pulses are overlapped in the time domain (pulses are partially time coincident) then separate feedback loops would be used to control each input signal channel; this is shown in FIG. 8 for two frequencies. As there shown, signals which have a carrier frequency F1 are provided for a first signal channel by RF souce 10 and signals which have a carrier frequency F2 are provided for a second signal channel by a RF source 10'. The two feedback loops shown in FIG. 8 each operate in a manner similar to that described herein above relative to FIG. 1. The loops respond to the appropriate respective frequencies due to filter 38 and 38' which applies feedback signals for control of the F1 and F2 signal channels respectively. The output signal sample from directional coupler 20 is applied to a coupler 36 and two output signals therefrom are applied as respective inputs to filters 38 and 38'. The amplitude and phase controlled signals from amplitude modulator 16 and 16' are combined by coupler 40 and applied as a combined input signal to RF amplifier 18. Computer 24 controls the attenuation of voltage controlled attenuators 22 and 22' in the manner described herein above relative to FIG. 1. The amplitude weighting functions need not be the same for both signal channels; for example, computer 24 may be programmed to apply the 35 db sidelobe level weights (see Table I) to the signals, for the F1 channel and 45 db sidelobe level weights to the signals for the F2 channel. It is noted that the multiple carrier frequency implementation reduces loss of average power capability associated with the input signal amplitude control technique since the variation in peak power output during the overlap time is less than the peak power variation for weighted waveforms having no overlap.

Thus having described a new and useful RF amplifier arrangement for providing output signals having a controlled or modified frequency distribution.

What is claimed is:

1. An RF amplifier arrangement for providing output signals having a controlled frequency distribution comprising:
   an RF amplifier; and
   means for causing said RF amplifier to produce pulsed output signals and including input means for applying input signals to said RF amplifier including means for adjusting the amplitude and phase of the input signals as a function of the amplitude and phase respectively of the output signals from said RF amplifier and for also adjusting the amplitude of the input signals so as to cause the power across each of the output signal pulses to vary in accordance with a predetermined sequence whereby such amplitude control of the input signals results in a modified frequency distribution in the energy of the output signals, and wherein said input means includes a source of RF signals, a controllable power adjustment device coupled to receive a portion of the output power from said RF amplifier, computer means programmed to control the relative response to said power adjustment device in accordance with said predetermined sequence, and means coupled between the output of said RF signal source and the input of said RF amplifier for adjusting the phase and amplitude of the input signal to said RF amplifier as a function of the phase and amplitude, respectively, of the output signal from said power adjustment device.

2. The RF amplifier arrangement of claim 1 further comprising means for measuring the output power of said RF amplifier and said computer means including means for scanning said controllable power adjustment device over a range of values and for storing the resultant parameters that produce the RF output power levels of said predetermined sequence.

3. The RF amplifier arrangement of claim 1 wherein said input means includes means for applying to said RF amplifier a series of input RF signal pulses which vary in amplitude across each of the pulses in accordance with a Dolph-Chebyskyv weighted pulse amplitude distribution.

4. The RF amplifier arrangement of claim 1 wherein said computer is programmed to store a series of parameters which control the relative responses of said adjustment device in accordance with said predetermined sequence.

* * * * *